United States Patent
Park et al.

(10) Patent No.: US 9,775,232 B2
(45) Date of Patent: Sep. 26, 2017

(54) MULTILAYER CERAMIC CAPACITOR AND BOARD HAVING THE SAME

(71) Applicant: SAMSUNG ELECTRO-MECHANICS CO., LTD., Suwon-Si, Gyeonggi-Do (KR)

(72) Inventors: Heung Kil Park, Suwon-Si (KR); Sang Soo Park, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 49 days.

(21) Appl. No.: 14/664,800

(22) Filed: Mar. 20, 2015

(65) Prior Publication Data
US 2016/0088725 A1    Mar. 24, 2016

(30) Foreign Application Priority Data
Sep. 23, 2014   (KR) .................. 10-2014-0127165

(51) Int. Cl.
| | |
|---|---|
| H01G 4/228 | (2006.01) |
| H01G 2/20 | (2006.01) |
| H01G 4/06 | (2006.01) |
| H01G 4/30 | (2006.01) |
| H05K 1/02 | (2006.01) |
| H01G 2/06 | (2006.01) |
| H01G 4/12 | (2006.01) |
| H01G 4/232 | (2006.01) |
| H05K 1/18 | (2006.01) |

(52) U.S. Cl.
CPC .......... *H05K 1/0271* (2013.01); *H01G 2/065* (2013.01); *H01G 4/1227* (2013.01); *H01G 4/232* (2013.01); *H01G 4/30* (2013.01); *H05K 1/181* (2013.01); *H05K 2201/0314* (2013.01); *H05K 2201/10015* (2013.01)

(58) Field of Classification Search
CPC .......... H01G 4/30; H01G 4/232; H01G 4/228; H01G 4/12
USPC .......... 361/306.3, 308.1, 306.1, 321.2, 301.4
See application file for complete search history.

(56) References Cited

U.S. PATENT DOCUMENTS

| | | | |
|---|---|---|---|
| 2004/0183147 A1* | 9/2004 | Togashi ............. | H01G 2/065 257/414 |
| 2007/0165361 A1* | 7/2007 | Randall ............. | H01G 4/30 361/306.3 |
| 2010/0091427 A1 | 4/2010 | Lee et al. | |

FOREIGN PATENT DOCUMENTS

| | | |
|---|---|---|
| JP | 4962533 B2 | 6/2012 |
| KR | 10-2010-0100722 A | 9/2010 |

* cited by examiner

*Primary Examiner* — Eric Thomas
*Assistant Examiner* — Arun Ramaswamy
(74) *Attorney, Agent, or Firm* — McDermott Will & Emery LLP

(57) ABSTRACT

A multilayer ceramic capacitor and a board having the same are provided. The multilayer ceramic capacitor includes a ceramic body including internal electrodes having lead-out portions formed on ends thereof, and external electrodes disposed on portions of end surfaces of the ceramic body to be connected to the lead-out portions, and terminal electrodes coupled to both end portions of the ceramic body and including horizontal portions disposed below the ceramic body and vertical portions spaced apart from the end surfaces of the ceramic body, connected to the external electrodes, and having groove portions, and conductive adhesion layers disposed on the vertical portions of the terminal electrodes to contact the external electrodes through the groove portions.

8 Claims, 11 Drawing Sheets

MULTILAYER CERAMIC CAPACITOR AND BOARD HAVING THE SAME

CROSS-REFERENCE TO RELATED APPLICATION

This application claims the priority and benefit of Korean Patent Application No. 10-2014-0127165 filed on Sep. 23, 2014, with the Korean Intellectual Property Office, the disclosure of which is incorporated herein by reference.

BACKGROUND

The present disclosure relates to a multilayer ceramic capacitor and a board having the same.

A multilayer ceramic capacitor (MLCC), a multilayer chip electronic component, may be used in various electronic apparatuses due to advantages thereof, such as a small size, high capacitance, and ease of mounting.

For example, the multilayer ceramic capacitor may be used as a chip type condenser installed on the boards of various electronic products such as display devices, for example, liquid crystal displays (LCDs), plasma display panels (PDPs), and the like, as well as computers, personal digital assistants (PDAs), and a mobile phones, serving to charge electricity in the batteries thereof or discharge electricity therefrom.

Multilayer ceramic capacitors may have a structure in which a plurality of dielectric layers and internal electrodes having different polarities with respective dielectric layers interposed therebetween are alternately disposed.

In this case, since the dielectric layer has piezoelectric properties, when a direct current (DC) or alternating current (AC) voltage is applied to the multilayer ceramic capacitor, a piezoelectric phenomenon may occur between the internal electrodes, thereby causing periodic vibrations while expanding and contracting a volume of a ceramic body according to the frequency thereof.

These vibrations may be transferred to the board through external electrodes of the multilayer ceramic capacitor and solders connecting the external electrodes and the board to each other, such that the entire board may act as a sound reflecting surface, whereby vibration sound, commonly known as noise, may occur.

This vibration sound may correspond to an audio frequency range of 20 to 20,000 Hz causing listener discomfort. This vibration sound causing listener discomfort, as described above, is known as acoustic noise.

In addition, as noiseless components have been provided in electronic equipment, the acoustic noise caused by the multilayer ceramic capacitor as described above may appear relatively more significantly.

Moreover, when equipment is operated in a relatively silent environment, users may perceive such acoustic noise as equipment component failure.

In addition, in the equipment having voice circuits, acoustic noise may be overlapped with voice output, which may cause a problem in which equipment has deteriorated quality in audio output.

SUMMARY

An aspect of the present disclosure may provide a multilayer ceramic capacitor having reduced acoustic noise and a board having the same.

According to an aspect of the present disclosure, a multilayer ceramic capacitor and a board having the same are provided. The multilayer ceramic capacitor may include a ceramic body including internal electrodes stacked in a width direction and having lead-out portions formed on ends of the internal electrodes, and external electrodes disposed on portions of end surfaces of the ceramic body in a length direction of the ceramic body to be connected to the lead-out portions of the internal electrodes, and terminal electrodes coupled to both end portions of the ceramic body. The terminal electrodes includes horizontal portions disposed below the ceramic body and vertical portions spaced apart from the end surfaces of the ceramic body in the length direction, connected to the external electrodes, and having groove portions. Conductive adhesion layers are disposed on the vertical portions of the terminal electrodes to contact the external electrodes through the groove portions.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
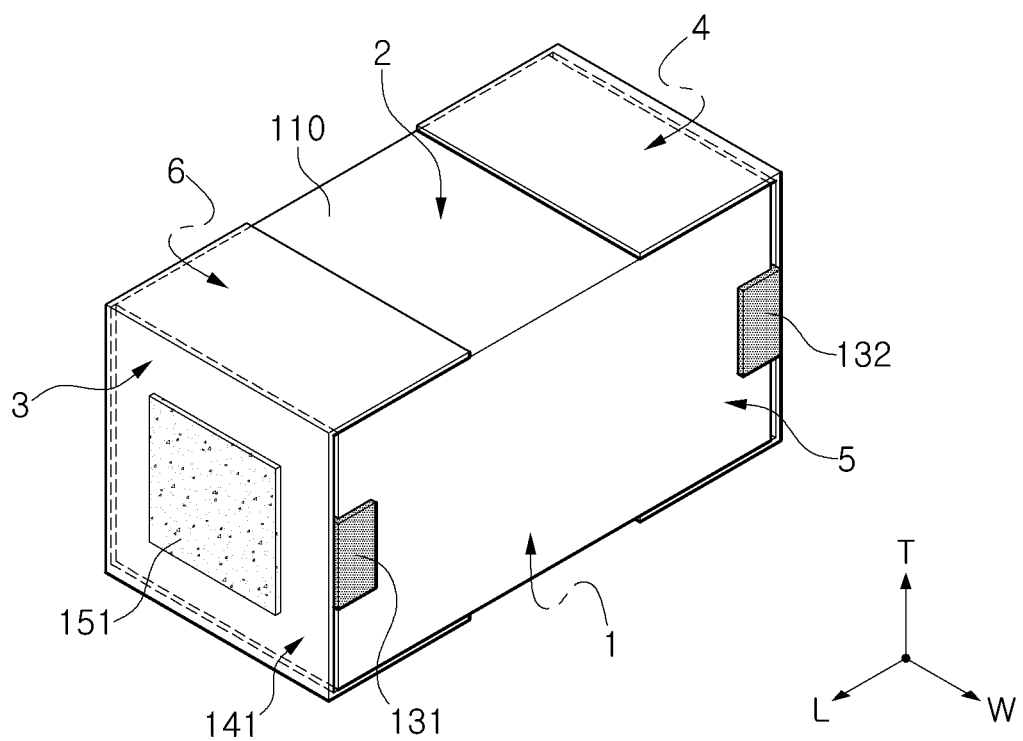
FIG. 1 is a perspective view schematically illustrating a multilayer ceramic capacitor according to an exemplary embodiment in the present disclosure.

Exemplary embodiments in the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2A:
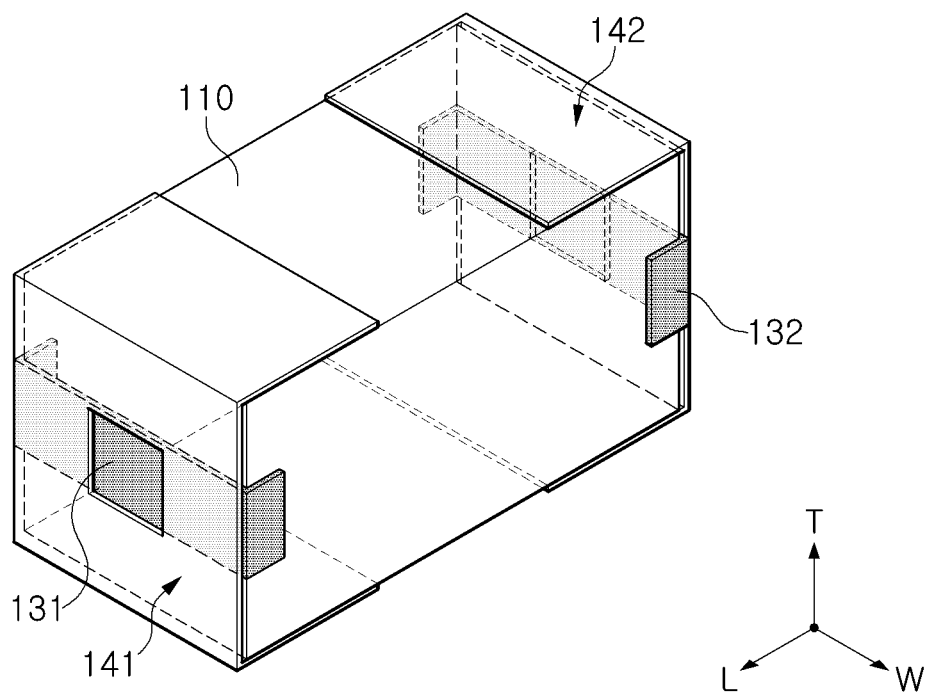
FIG. 2A is a perspective view illustrating the multilayer ceramic capacitor of FIG. 1 from which a conductive adhesion layer is removed.
Figure 2B:
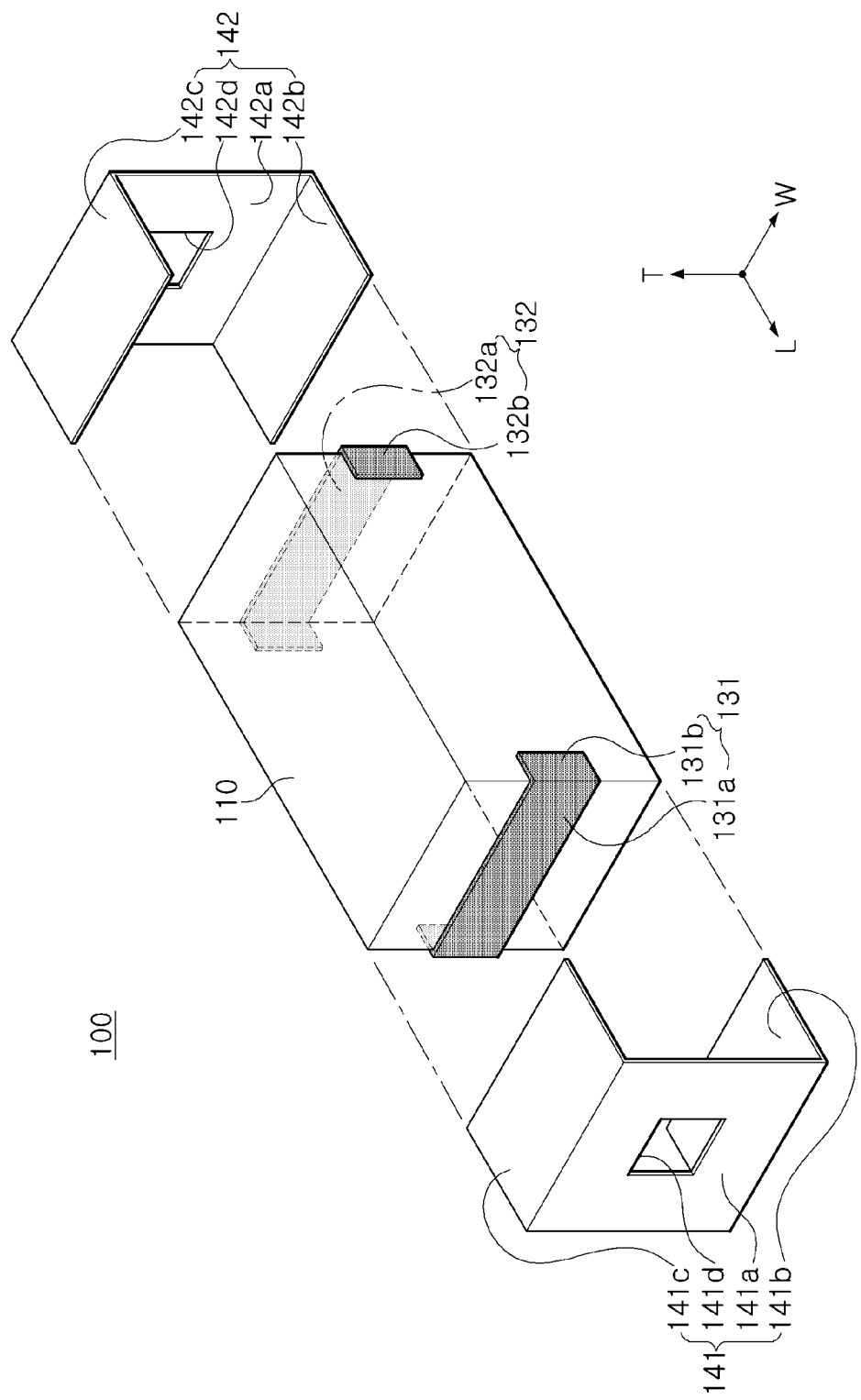
FIG. 2B is a perspective view illustrating the multilayer ceramic capacitor of FIG. 1 from which a conductive adhesion layer is removed and terminal electrodes are separated.

FIG. 1 is a perspective view schematically illustrating a multilayer ceramic capacitor according to an exemplary embodiment in the present disclosure; FIG. 2A is a perspective view illustrating the multilayer ceramic capacitor of FIG. 1 from which a conductive adhesion layer is removed; FIG. 2B is a perspective view illustrating the multilayer ceramic capacitor of FIG. 1 from which a conductive adhesion layer is removed and terminal electrodes are separated; and FIG. 3 is an exploded perspective view illustrating a structure of internal electrodes in the multilayer ceramic capacitor of FIG. 1.

Figure 3:
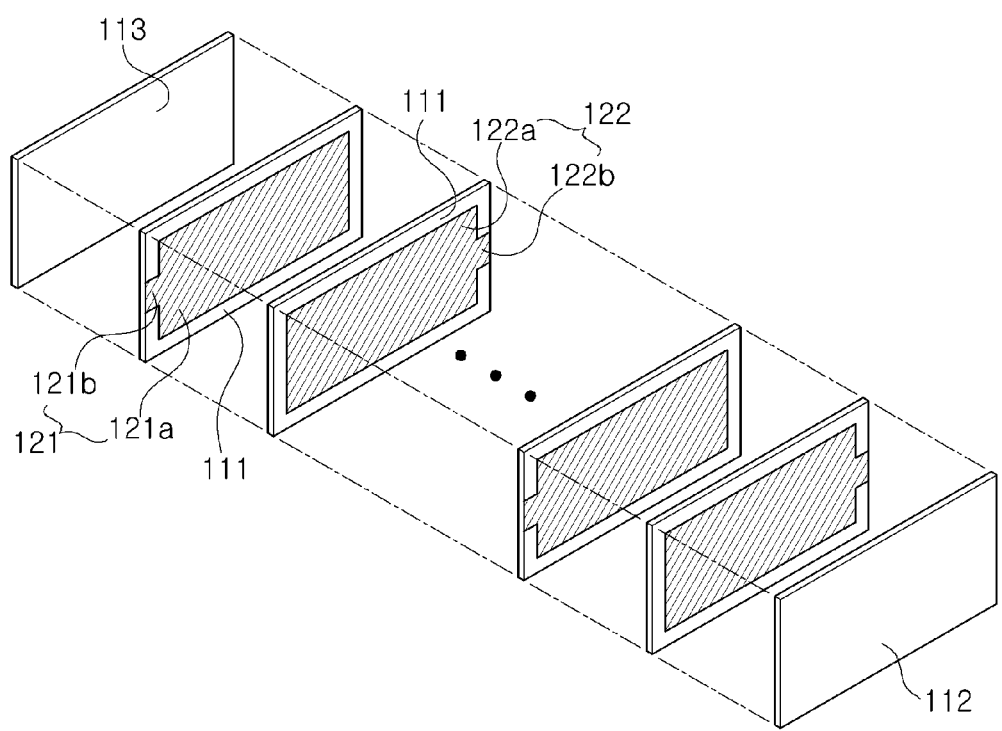
FIG. 3 is an exploded perspective view illustrating a structure of internal electrodes in the multilayer ceramic capacitor of FIG. 1.

Referring to FIGS. 1 through 3, the multilayer ceramic capacitor 100 according to an exemplary embodiment in the present disclosure may include a ceramic body 110; a plurality of first and second internal electrodes 121 and 122, first and second external electrodes 131 and 132; first and second terminal electrodes 141 and 142; and first and second conductive adhesion layers 151 and 152.

The ceramic body 110 may be formed by stacking a plurality of dielectric layers 111 in a width direction and performing a sintering process.

Here, the respective adjacent dielectric layers 111 of the ceramic body 110 may be integrated with each other so that boundaries therebetween are not readily discerned without using a scanning electron microscope (SEM).

In addition, the ceramic body 110 may have a hexahedral shape. However, the present disclosure is not limited thereto.

In the exemplary embodiment of the present disclosure, for convenience of explanation, surfaces opposing each other in a thickness direction which is a vertical direction in which the dielectric layers 111 of the ceramic body 110 are stacked refer to an upper surface and a lower surface, respectively, and here, the lower surface refers to a mounting surface.

Further, the ceramic body 110 is not specifically limited in dimensions, for example, may have a size of 1.6 mm×0.8 mm, or the like, to thereby configure the multilayer ceramic capacitor 100 having relatively high capacitance.

In addition, cover layers 112 and 113 having a predetermined thickness may be formed on both side surfaces of the ceramic body 110 in the width direction, as needed.

A thickness of one dielectric layer 111 may be optionally changed according to a capacitance design of the multilayer ceramic capacitor 100, and in detail, the thickness of one dielectric layer 111 may be configured to be about 1.0 μm after sintering. However, the present disclosure is not limited thereto.

In addition, the dielectric layer 111 may include a high-k ceramic material, for example, a barium titanate ($BaTiO_3$) based ceramic powder, or the like. However, the present disclosure is not limited thereto.

An example of the $BaTiO_3$-based ceramic powder may have $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, and the like, in which Ca, Zr, or the like, is partially dissolved in $BaTiO_3$. However, the present disclosure is not limited thereto.

Meanwhile, in addition to the ceramic powder, the dielectric layer 111 may further contain ceramic additives, organic solvents, plasticizers, binders, dispersants, and the like.

As the ceramic additive, for example, a transition metal oxide or carbide, a rare earth element, magnesium (Mg), aluminum (Al), or the like, may be used.

The first and second internal electrodes 121 and 122 may be formed on ceramic sheets forming the dielectric layers 111 and stacked, and then sintered, such that the first and second internal electrodes 121 and 122 are alternately disposed in the ceramic body 110 with each of the dielectric layers 111 interposed therebetween.

The first and second internal electrodes 121 and 122, which are a pair of electrodes having different polarities, may be disposed to face each other in a direction in which the dielectric layers 111 are stacked and may be electrically insulated from each other by the dielectric layers 111 interposed therebetween.

The first and second internal electrodes 121 and 122 may include first and second capacitance parts 121a and 122a forming a capacitance by overlapping with adjacent internal electrodes, and first and second lead-out portions 121b and 122b exposed through both end surfaces of the ceramic body 110 in a length direction thereof by extending portions of the first and second capacitance parts 121a and 122a.

The first and second lead-out portions 121b and 122b of the first and second internal electrodes 121 and 122 alternately exposed through both end surfaces of the ceramic body 110 may be electrically connected to the first and second external electrodes 131 and 132, respectively, on both end surfaces of the ceramic body 110 in the length direction of the ceramic body 110.

Here, the first and second internal electrodes 121 and 122 may be formed of a conductive metal, for example, a material such as nickel (Ni), a nickel (Ni) alloy, or the like. However, the present disclosure is not limited thereto.

According to the configuration as described above, when predetermined voltages are applied to the first and second external electrodes 131 and 132, electric charges may be accumulated between the first and second internal electrodes 121 and 122 facing each other.

Here, a capacitance of the multilayer ceramic capacitor 100 may be in proportion to an overlapped area of the first and second capacitance parts 121a and 122a of the first and second internal electrodes 121 and 122 which are overlapped with each other in a direction in which the dielectric layers 111 are stacked.

The first and second external electrodes 131 and 132 may be formed by sintering conductive pastes for external electrodes containing copper (Cu) so as to have an excellent electrical property and provide high reliability such as excellent heat cycle resistance, moisture resistance, and the like. However, the present disclosure is not limited thereto.

The first and second external electrodes 131 and 132 may only be disposed on portions of both end surfaces of the ceramic body 110 in the length direction, to which the first and second lead-out portions 121b and 122b of the first and second internal electrodes 121 and 122 are exposed, and may include first and second front parts 131a and 132a connected to the first and second lead-out portions 121b and 122b, respectively, to be electrically connected to the first and second internal electrodes 121 and 122, and a pair of first and second band portions 131b and 132b extended from the first and second front parts 131a and 132a onto portions of both side surfaces of the ceramic body 110 in the width direction.

The first and second band portions 131b and 132b may improve adhesive strength of the first and second external electrodes 131 and 132. In addition, as necessary, the first and second external electrodes 131 and 132 may have plating layers formed thereon.

The first and second terminal electrodes 141 and 142 may be formed in an '⌐' shape, and may include first and second horizontal portions 141b and 142b disposed below the ceramic body 110 and first and second vertical portions 141a and 142a extended from edges of the first and second horizontal portions 141b and 142b upwardly thereof and contacting the first and second external electrodes 131 and 132 to be electrically connected to each other.

Here, the first and second vertical portions 141a and 142a may be disposed to be spaced apart from both end surfaces of the ceramic body 110 in the length direction. In addition, the first and second horizontal portions 141b and 142b may be surface-treated by nickel/tin, nickel/gold plating, or the like, to have excellent contactability with solder at the time of mounting the capacitor on the board.

Further, the first and second horizontal portions 141b and 142b may be disposed to be spaced apart from the lower surface of the ceramic body 110. In this case, since the first and second terminal electrodes 141 and 142 are in direct contact only with the first and second external electrodes 131 and 132 having a significantly small area as compared to that of the end surface of the ceramic body 110 in the length direction, an area in which piezoelectric vibrations are transferred from the ceramic body 110 may be limited, and the vibrations transferred from the ceramic body 110 may be effectively offset by elastic force of the first and second terminal electrodes 141 and 142, such that vibration amounts transferred to the board may be decreased, thereby significantly reducing acoustic noise.

In addition, the first and second terminal electrodes 141 and 142 may include first and second upper horizontal portions 141c and 142c extended from the first and second vertical portions 141a and 142a to portions of the upper surface of the ceramic body 110.

The first and second upper horizontal portions 141c and 142c may increase positioning accuracy when the first and second terminal electrodes 141 and 142 are disposed on both end surfaces of the ceramic body 110 in the length direction.

In addition, first and second groove portions 141d and 142d may be formed in the center of the first and second vertical portions 141a and 142a.

Here, the first and second groove portions 141d and 142d may decrease the area which becomes medium of vibrations, such that vibrations transferred from the first and second external electrodes 131 and 132 may be decreased.

The first and second terminal electrodes 141 and 142 may absorb mechanical vibrations caused by the piezoelectric property of the multilayer ceramic capacitor 100 using elastic force, such that vibrations may be prevented from being transferred to the board on which the multilayer ceramic capacitor is mounted, which may reduce acoustic noise.

In addition, mechanical stress caused by deformation of the mounting board may be absorbed by elastic force of the first and second terminal electrodes 141 and 142, and mechanical stress reaching the ceramic body 110 may also be reduced, such that defects such as cracks and the like, or damages occurring in the ceramic body 110 may be prevented, whereby reliability may be improved.

In addition, according to the exemplary embodiment in the present disclosure, sufficient elastic force may be obtained by the first and second terminal electrodes 141 and 142, such that the first and second horizontal portions 141b and 142b of the first and second terminal electrodes 141 and 142 and the lower surface of the ceramic body 110 may contact each other, or when they are spaced apart from each other, a significantly decreased interval therebetween may be maintained, whereby a product may have significantly decreased height.

The first and second conductive adhesion layers 151 and 152 may be disposed on the first and second vertical portions 141a and 142a of the first and second terminal electrodes 141 and 142, and may contact the first and second front parts 131a and 132a of the first and second external electrodes 131 and 132 through the first and second groove portions 141d and 142d, which allows the first and second external electrodes 131 and 132 to bond to the first and second terminal electrodes 141 and 142 to be electrically connected to each other, respectively.

Figure 4:
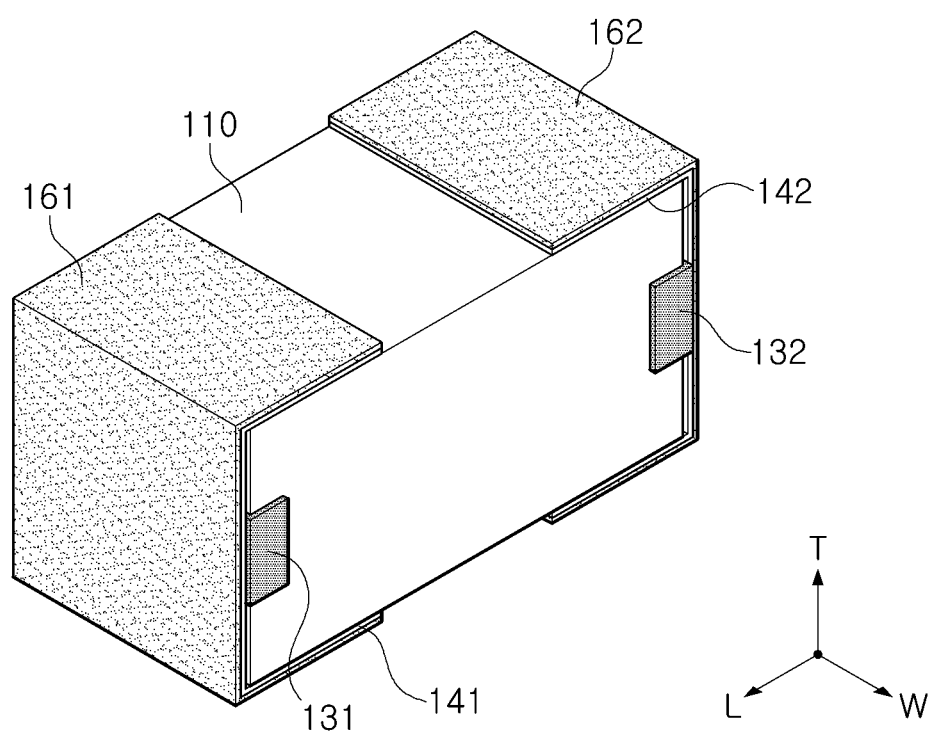
FIG. 4 is a perspective view of the multilayer ceramic capacitor of FIG. 1 which further includes a plating layer.

Meanwhile, referring to FIG. 4, the first and second plating layers 161 and 162 may be formed on the first and second terminal electrodes 141 and 142. As an example, the first and second plating layers 161 and 162 may include first and second nickel (Ni) plating layers formed on the first and second terminal electrodes 141 and 142, respectively, and first and second tin (Sn) plating layers formed on the first and second nickel plaiting layers, respectively. In addition, the first and second plating layers 161 and 162 may be extended onto portions of both side surfaces of the ceramic body 110 in the width direction to cover the first and second band portions 131b and 132b of the first and second external electrodes 131 and 132.

Figure 5:
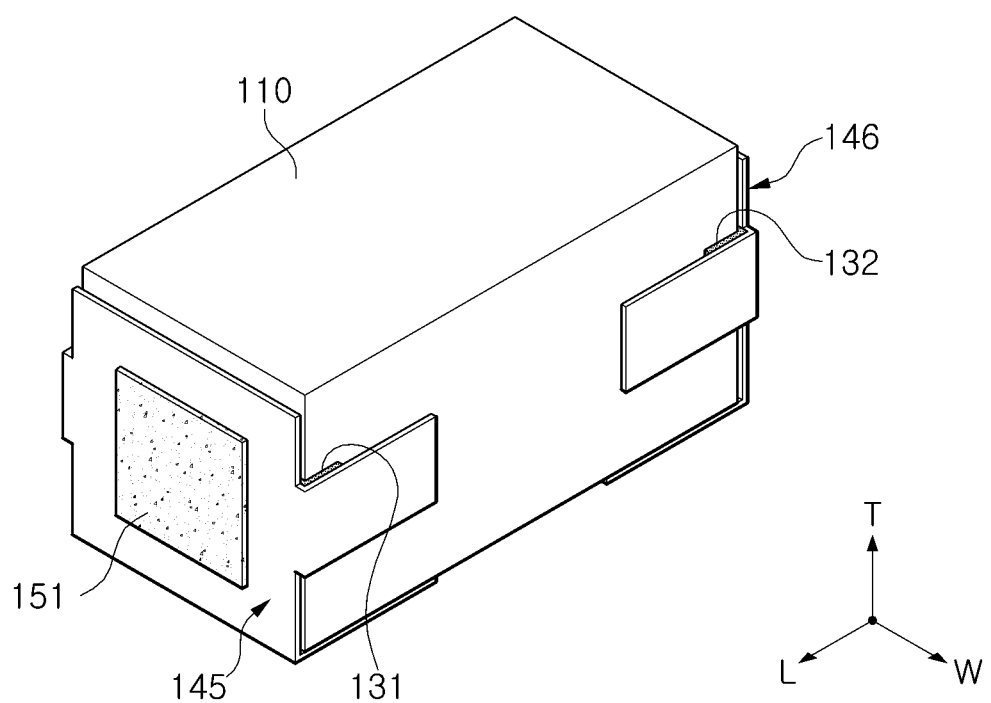
FIG. 5 is a perspective view schematically illustrating a multilayer ceramic capacitor according to another exemplary embodiment in the present disclosure.
Figure 6:
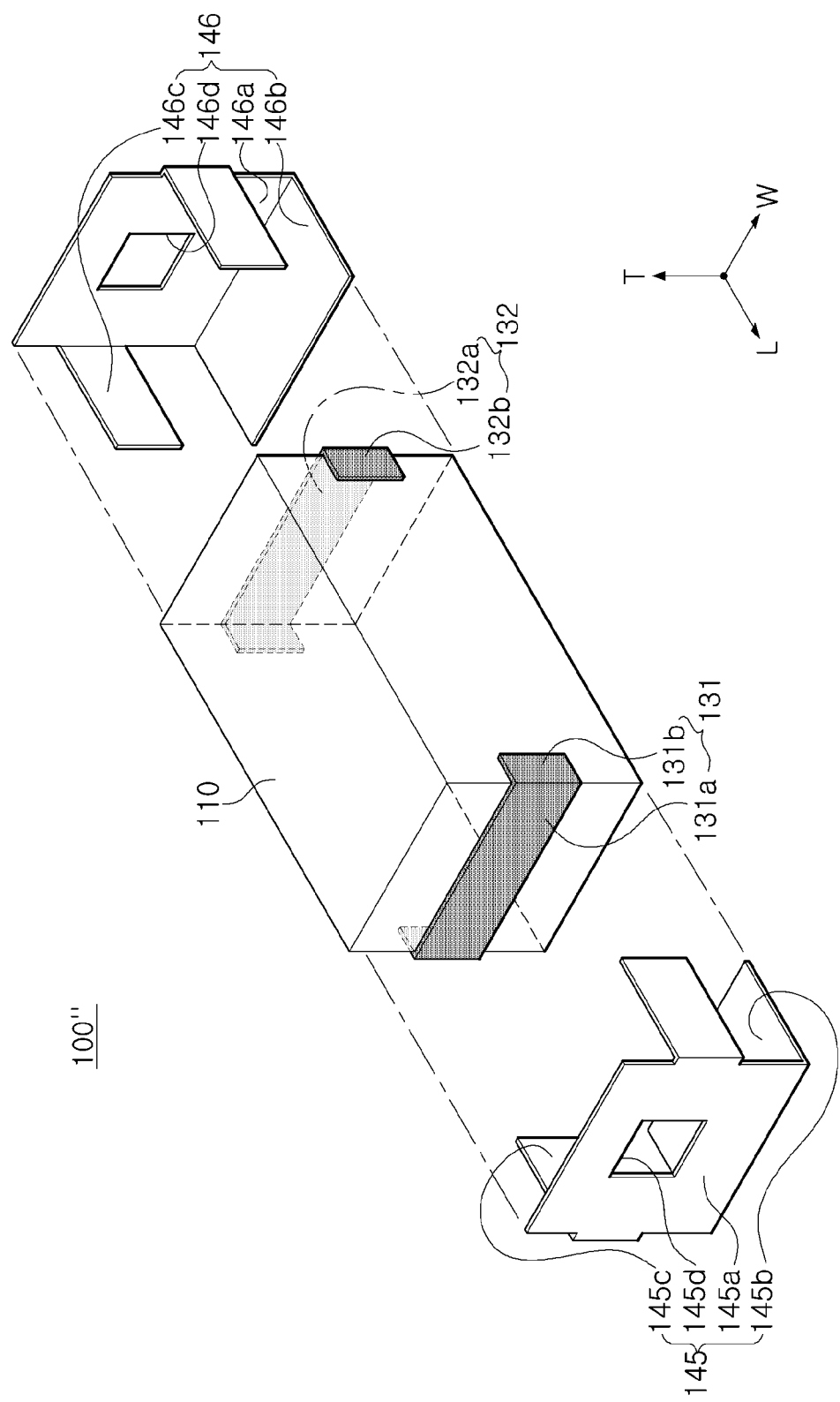
FIG. 6 is a perspective view illustrating the multilayer ceramic capacitor of FIG. 5 from which a conductive adhesion layer is removed.

FIG. 5 is a perspective view schematically illustrating a multilayer ceramic capacitor 110" according to another exemplary embodiment in the present disclosure, and FIG. 6 is a perspective view illustrating the multilayer ceramic capacitor 110" of FIG. 5 from which the conductive adhesion layer is removed.

Here, since structures of the ceramic body 110, the first and second internal electrodes 121 and 122, the first and second external electrodes 131 and 132, and the first and second conductive adhesion layers 151 and 152 are similar to those of the previously described exemplary embodiment, detailed descriptions thereof will be omitted, and first and second terminal electrodes 145 and 146 having a different configuration from the previously described exemplary embodiment will be described.

Referring to FIGS. 5 and 6, the first and second terminal electrodes 145 and 146 according to the exemplary embodiment in the present disclosure may include a pair of first and second guide parts 145c and 146c extended from both side edge portions of the first and second vertical portions 145a and 146a onto portions of both side surfaces of the ceramic body 110 in the width direction.

The first and second guide parts 145c and 146c may increase positioning accuracy to improve manufacturing efficiency when the first and second terminal electrodes 145 and 146 are disposed on both end surfaces of the ceramic body 110 in the length direction.

Here, reference numerals 145b and 146b refer to the first and second horizontal portions of the first and second terminal electrodes 145 and 146 according to the exemplary embodiment in the present disclosure, and reference numerals 145d and 146d refer to the first and second groove portions of the first and second terminal electrodes 145 and 146 according to the exemplary embodiment in the present disclosure.

Figure 7:
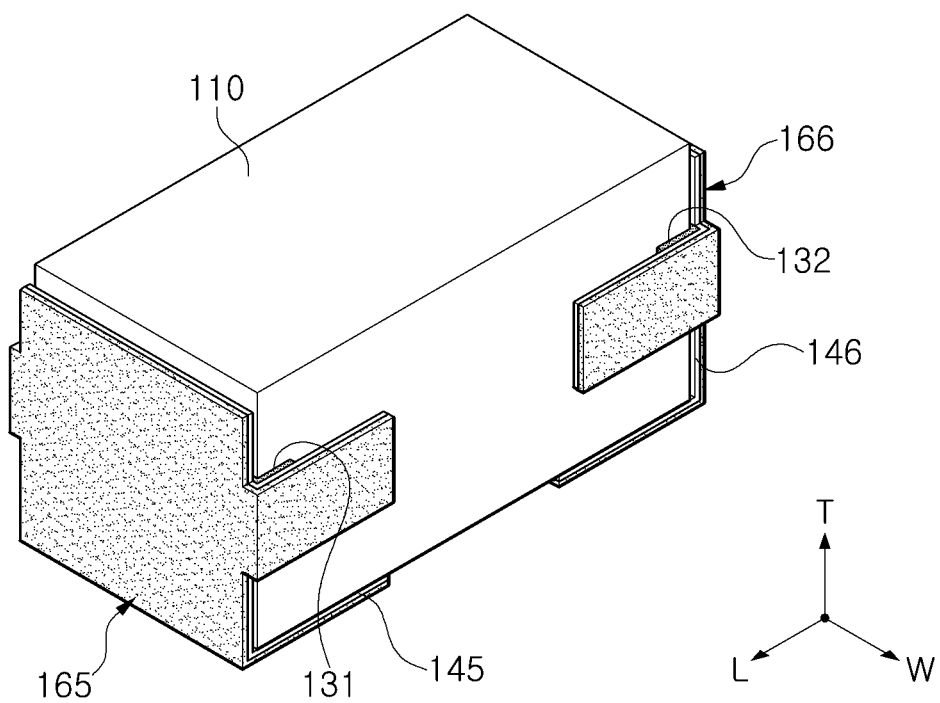
FIG. 7 is a perspective view of the multilayer ceramic capacitor of FIG. 5 which further includes a plating layer.

Meanwhile, referring to FIG. 7, the first and second plating layers 165 and 166 may be formed on the first and second terminal electrodes 145 and 146. As an example, the first and second plating layers 165 and 166 may include first and second nickel (Ni) plating layers formed on the first and second terminal electrodes 145 and 146, respectively, and first and second tin (Sn) plating layers formed on the first and second nickel plaiting layers, respectively. In addition, the first and second plating layers 165 and 166 may be extended onto portions of both side surfaces of the ceramic body 110 in the width direction to cover the first and second band portions 131b and 132b of the first and second external electrodes 131 and 132.

Figure 8A:
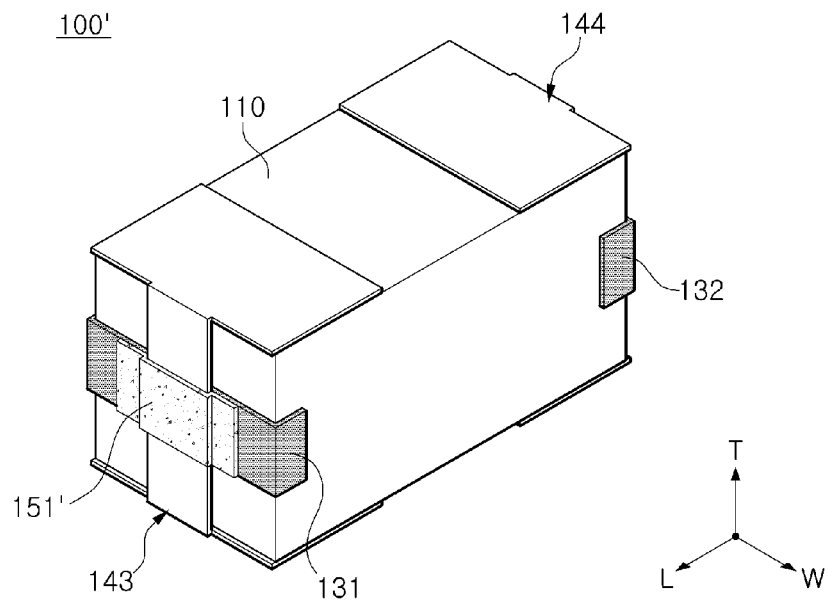
FIGS. 8A and 8B are perspective views schematically illustrating a multilayer ceramic capacitor according to another exemplary embodiment in the present disclosure.
Figure 8B:
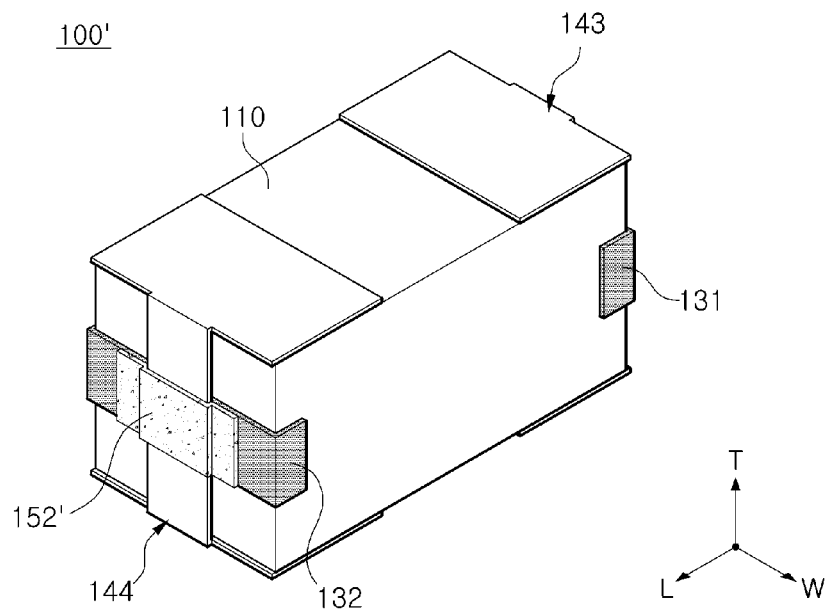
Figure 9:
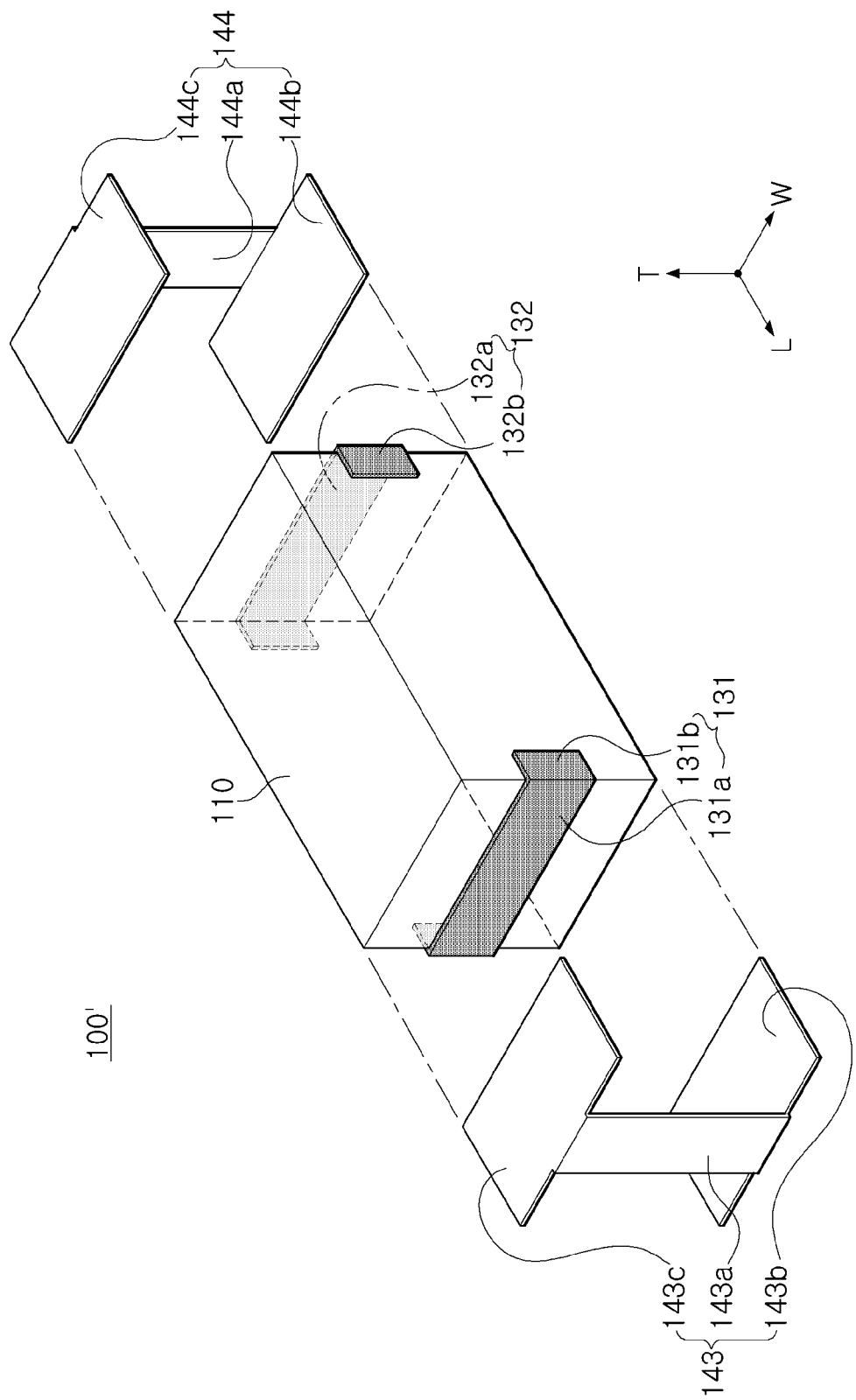
FIG. 9 is a perspective view illustrating the multilayer ceramic capacitor of FIG. 8 from which a conductive adhesion layer is removed.

FIG. 8 is a perspective view schematically illustrating a multilayer ceramic capacitor 100' according to another exemplary embodiment in the present disclosure, and FIG. 9 is a perspective view illustrating the multilayer ceramic capacitor 100' of FIG. 8 from which the conductive adhesion layer is removed.

Here, since structures of the ceramic body 110, the first and second internal electrodes 121 and 122, and the first and second external electrodes 131 and 132 are similar to those of the previously described exemplary embodiment, detailed descriptions thereof will be omitted, and first and second terminal electrodes 143 and 144 and the first and second conductive adhesion layers 151' and 152' having a different configuration from that of the previously described exemplary embodiment will be described.

Referring to FIGS. 8 and 9, the first and second terminal electrodes 143 and 144 according to the exemplary embodiment in the present disclosure may have recess portions formed on both sides of the first and second vertical portions 143a and 144a, respectively. Here, groove portions (not shown) may be selectively formed in the center of the first and second vertical portions 143a and 144a.

In this case, the recess portions in both sides may decrease an area in which the first and second terminal electrodes 143 and 144 contact the first and second front parts 131a and 132a of the first and second external electrodes 131 and 132 each other, such that vibrations transferred from the first and second external electrodes 131 and 132 may be decreased.

Here, reference numerals 143b and 144b refer to the first and second horizontal portions of the first and second terminal electrodes 143 and 144 according to the exemplary embodiment in the present disclosure, and reference numerals 143c and 144c refer to the first and second upper horizontal portions of the first and second terminal electrodes 143 and 144 of the exemplary embodiment in the present disclosure.

Here, the first and second conductive adhesion layers 151' and 152' may be disposed on the first and second vertical portions 143a and 144a of the first and second terminal electrodes 143 and 144 to be perpendicular to the first and second vertical portions 143a and 144a, respectively, and both end portions of the first and second conductive adhesion layers 151' and 152' may contact the first and second front parts 131a and 132a of the first and second external electrodes 131 and 132, which allows the first and second external electrodes 131 and 132 to be bonded to the first and second terminal electrodes 141 and 142 so as to be electrically connected to each other.

Figure 10:
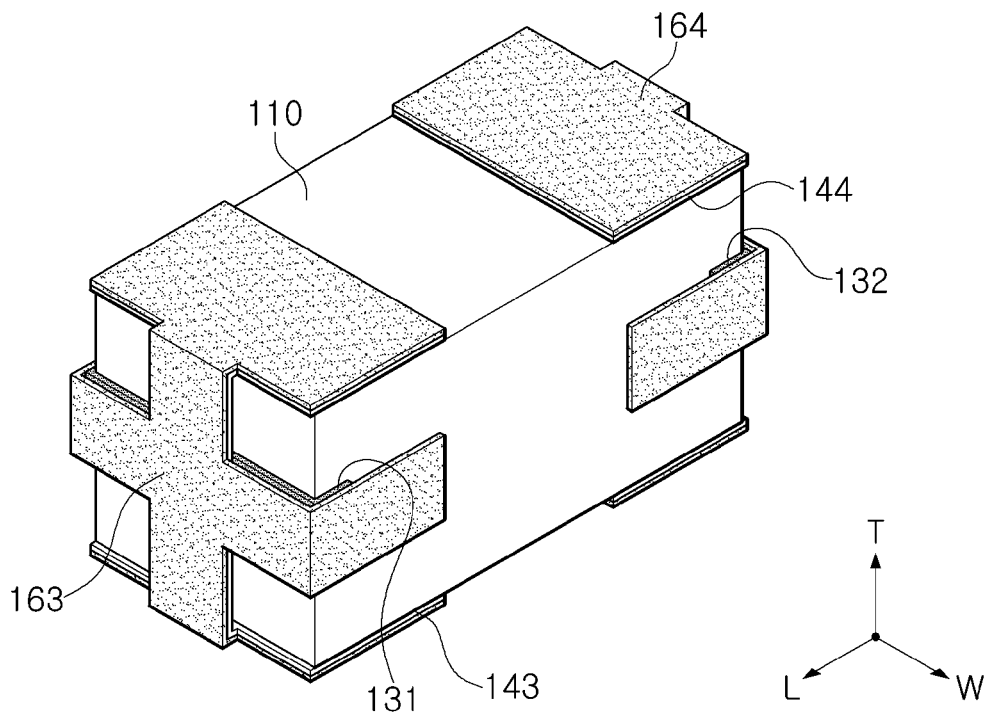
FIG. 10 is a perspective view of the multilayer ceramic capacitor of FIG. 8 which further includes a plating layer.

Meanwhile, referring to FIG. 10, the first and second plating layers 163 and 164 may be formed on the first and second terminal electrodes 143 and 144. As an example, the first and second plating layers 163 and 164 may include first and second nickel (Ni) plating layers formed on the first and second terminal electrodes 143 and 144, respectively, and first and second tin (Sn) plating layers formed on the first and second nickel plaiting layers, respectively. In addition, the first and second plating layers 163 and 164 may be formed to cover the first and second conductive adhesion layers 151' and 152' and the first and second front parts 131a and 132a and the first and second band portions 131b and 132b of the first and second external electrodes 131 and 132.

Figure 11:
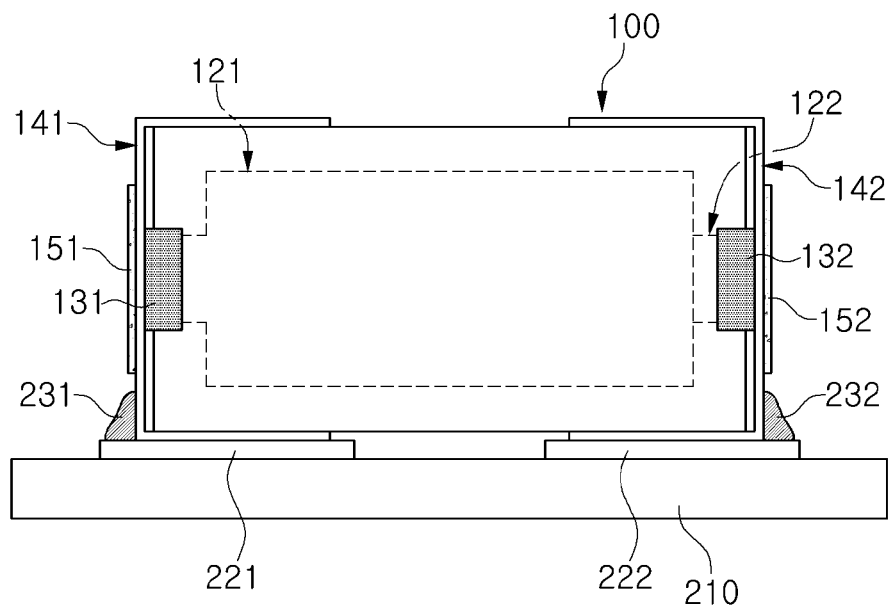
FIG. 11 is a lateral cross-sectional view schematically illustrating a board on which a multilayer ceramic capacitor according to an exemplary embodiment in the present disclosure is mounted.

FIG. 11 is a lateral cross-sectional view schematically illustrating a board on which the multilayer ceramic capacitor according to an exemplary embodiment in the present disclosure is mounted.

Referring to FIG. 11, a board on which the multilayer ceramic capacitor 100 according to the exemplary embodiment in the present disclosure is mounted may include a circuit board 210 on which the multilayer ceramic capacitor 100 is mounted, and first and second electrode pads 221 and 222 formed on the circuit board 210 to be spaced apart from each other.

The multilayer ceramic capacitor 100 may be bonded and electrically connected to the circuit board 210 by solders 231 and 232 in a state in which the first and second horizontal portions 141b and 142b of the first and second terminal electrodes 141 and 142 disposed on a lower surface which is the mounting surface of the ceramic body 110 are positioned to contact the first and second electrode pads 221 and 222 of the circuit board 210, respectively.

As described above, when voltages having different polarities are applied to the first and second external electrodes 131 and 132 formed on both end portions of the multilayer ceramic capacitor 100 in a state in which the multilayer ceramic capacitor 100 is mounted on the circuit board 210, the ceramic body 110 may be expanded and contracted in the thickness direction due to an inverse piezoelectric effect of the dielectric layers 111, and both end portions of the first and second external electrodes 131 and 132 may be contracted and expanded in directions opposite to those of expansion and contraction of the ceramic body 110 in the thickness direction, due to a Poisson effect.

The contraction and expansion may cause vibrations. In addition, vibrations may be transferred from the first and second external electrodes 131 and 132 to the circuit board 210. Therefore, sound may be radiated from the circuit board 210, which becomes the acoustic noise.

According to the exemplary embodiment in the present disclosure, piezoelectric vibrations transferred to the board through the first and second external electrodes 131 and 132 of the multilayer ceramic capacitor 100 may be absorbed by elastic force of the first and second terminal electrodes 141 and 142, and mechanical stress caused by warpage of the board, and the like, may be absorbed by the first and second terminal electrodes 141 and 142, such that acoustic noise may be reduced.

As set forth above, according to exemplary embodiments in the present disclosure, the external electrodes may have an area smaller than that of the end surface of the ceramic body in the length direction, and elastic force of the terminal electrodes bonded to the external electrodes and spaced apart from the end surfaces of the ceramic body in the length direction may absorb vibrations transferred through the external electrodes of the ceramic body, such that acoustic noise may be reduced.

While exemplary embodiments have been shown and described above, it will be apparent to those skilled in the art that modifications and variations could be made without departing from the scope of the present disclosure as defined by the appended claims.

What is claimed is:
1. A multilayer ceramic capacitor comprising:
a ceramic body including a plurality of dielectric layers stacked in a width direction of the ceramic body;

a plurality of internal electrodes disposed in the ceramic body with respective dielectric layers interposed therebetween, and having lead-out portions formed on ends of the plurality of internal electrodes and alternately exposed to end surfaces of the ceramic body, wherein a width of the lead-out portions is less than a width of body portions of the internal electrodes;

external electrodes disposed on portions of the end surfaces of the ceramic body to be connected to the exposed lead-out portions of the internal electrodes;

terminal electrodes including horizontal portions disposed below the ceramic body and vertical portions extended upwardly from edges of the horizontal portions, spaced apart from the end surfaces of the ceramic body, connected to the external electrodes, and having openings formed on the vertical portions so that portions of the external electrodes are exposed; and conductive adhesion layers disposed in the openings of the vertical portions of the terminal electrodes, wherein the external electrodes and the terminal electrodes are in contact with each other by the conductive adhesion layers and are electrically connected to each other.

2. The multilayer ceramic capacitor of claim 1, wherein the external electrodes include band portions extended onto portions of both side surfaces of the ceramic body.

3. The multilayer ceramic capacitor of claim 1, wherein the horizontal portion of the terminal electrode is spaced apart from a lower surface of the ceramic body.

4. The multilayer ceramic capacitor of claim 1, wherein the terminal electrode further includes an upper horizontal portion extended from an upper end of the vertical portion onto a portion of an upper surface of the ceramic body.

5. The multilayer ceramic capacitor of claim 1, further comprising plating layers formed on the terminal electrodes to cover the conductive adhesion layers.

6. The multilayer ceramic capacitor of claim 2, further comprising plating layers formed on the terminal electrodes to cover the conductive adhesion layers and the band portions of the external electrodes.

7. The multilayer ceramic capacitor of claim 1, wherein the terminal electrodes further include guide parts extended from the vertical portion onto portions of both side surfaces of the ceramic body.

8. A board having a multilayer ceramic capacitor, comprising:
    a circuit board having a pair of electrode pads disposed thereon; and
    a multilayer ceramic capacitor disposed on the circuit board,
    wherein the multilayer ceramic capacitor includes:
    a ceramic body including a plurality of dielectric layers stacked in a width direction of the ceramic body;
    a plurality of internal electrodes disposed in the ceramic body with respective dielectric layers interposed therebetween, and having lead-out portions formed on ends of the plurality of internal electrodes and alternately exposed to end surfaces of the ceramic body, wherein a width of the lead-out portions is less than a width of body portions of the internal electrodes;
    external electrodes disposed on portions of the end surfaces of the ceramic body to be connected to the exposed lead-out portions of the internal electrodes;
    terminal electrodes including horizontal portions disposed below the ceramic body and connected to the electrode pads, and vertical portions extended upwardly from edges of the horizontal portions, spaced apart from the end surfaces of the ceramic body, connected to the external electrodes, and having openings formed on the vertical portions so that portions of the external electrodes are exposed; and
    conductive adhesion layers disposed in the openings of the vertical portions of the terminal electrodes,
    wherein the external electrodes and the terminal electrodes are in contact with each other by the conductive adhesion layers and are electrically connected to each other.

* * * * *